United States Patent
Lee et al.

(10) Patent No.: US 8,823,077 B2
(45) Date of Patent: Sep. 2, 2014

(54) SEMICONDUCTOR DEVICE AND METHOD OF MANUFACTURING THE SAME

(75) Inventors: Eun-Hong Lee, Anyang-si (KR);
Seung-Hun Hong, Seoul (KR);
Un-jeong Kim, Yongin-si (KR);
Hyung-Woo Lee, Anyang-si (KR); Sung Myung, Seoul (KR)

(73) Assignees: Samsung Electronics Co., Ltd., Gyeonggi-Do (KR); SNU R&D Foundation, Seoul (KR)

( * ) Notice: Subject to any disclaimer, the term of this patent is extended or adjusted under 35 U.S.C. 154(b) by 328 days.

(21) Appl. No.: 12/929,517

(22) Filed: Jan. 31, 2011

(65) Prior Publication Data

US 2011/0204332 A1    Aug. 25, 2011

(30) Foreign Application Priority Data

Feb. 25, 2010   (KR) .......................... 10-2010-0017291

(51) Int. Cl.
| | | |
|---|---|---|
| *H01L 29/788* | (2006.01) | |
| *H01L 51/10* | (2006.01) | |
| *B82Y 10/00* | (2011.01) | |
| *H01L 51/00* | (2006.01) | |
| *H01L 51/05* | (2006.01) | |

(52) U.S. Cl.
CPC ............ *H01L 51/102* (2013.01); *H01L 51/105* (2013.01); *B82Y 10/00* (2013.01); *H01L 51/0048* (2013.01); *H01L 51/0541* (2013.01)
USPC ............... 257/322; 257/E29.245; 257/365

(58) Field of Classification Search
CPC ..................................................... H01L 51/105
USPC ................................... 257/322, 365, E29.245
See application file for complete search history.

(56) References Cited

U.S. PATENT DOCUMENTS

| | | | |
|---|---|---|---|
| 2006/0220094 A1 | 10/2006 | Lojek | |
| 2008/0121996 A1* | 5/2008 | Park et al. ...................... | 257/365 |
| 2008/0151603 A1* | 6/2008 | Radosavljevic et al. ...... | 365/151 |
| 2009/0101962 A1* | 4/2009 | Hong et al. .................... | 257/322 |

FOREIGN PATENT DOCUMENTS

| | | |
|---|---|---|
| EP | 1763037 A1 | 3/2007 |
| KR | 20060024193 A | 3/2006 |
| KR | 20080078318 A | 8/2008 |
| KR | 20090025842 A | 3/2009 |
| KR | 20090039610 A | 4/2009 |
| KR | 20090089003 A | 8/2009 |
| KR | 20090113035 A | 10/2009 |

OTHER PUBLICATIONS

Rao, et al., "Large-Scale Assembly of Carbon Nanotubes", Nature, vol. 425, Sep. 4, 2003, pp. 36-37.

\* cited by examiner

*Primary Examiner* — Matthew Reames
(74) *Attorney, Agent, or Firm* — Harness, Dickey & Pierce, P.L.C.

(57) ABSTRACT

A semiconductor device according to example embodiments may include a channel including a nanowire and a charge storage layer including nanoparticles. A twin gate structure including a first gate and a second gate may be formed on the charge storage layer. The semiconductor device may be a memory device or a diode.

11 Claims, 7 Drawing Sheets

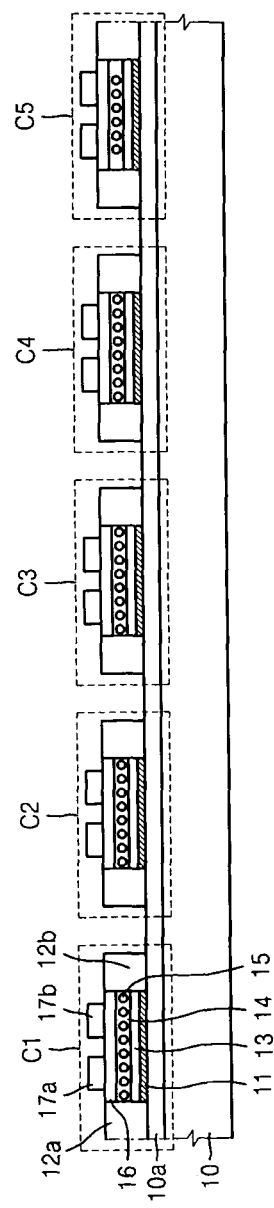

SEMICONDUCTOR DEVICE AND METHOD OF MANUFACTURING THE SAME

CROSS-REFERENCE TO RELATED APPLICATION

This application claims priority under 35 U.S.C. §119 to Korean Patent Application No. 10-2010-0017291, filed on Feb. 25, 2010 with the Korean Intellectual Property Office, the disclosure of which is incorporated herein in its entirety by reference.

BACKGROUND

1. Field

The present disclosure relates to semiconductor devices including a twin gate structure and methods of manufacturing the same.

2. Description of the Related Art

Silicon-based semiconductor devices have become more integrated through the continuous improvement of miniaturization processes. However, because of limitations of characteristics and manufacturing processes of silicon materials, it has become relatively difficult to further increase the integration of silicon-based semiconductor devices.

Thus, studies have been conducted on devices that may overcome the limitations of silicon-based semiconductor devices. In this regard, nanostructure-based electronic devices have been proposed. For example, carbon nanotubes (CNTs) have been used to manufacture relatively highly integrated electronic devices having improved performance. Because a CNT diameter is relatively small, ranging from several to few tens of nm, CNTs are advantageous for miniaturizing devices. Also, CNTs have improved mobility, electrical conductivity, thermal conductivity, and mechanical strength. In this regard, various attempts to manufacture semiconductor devices by using nanostructures including such CNTs have been made.

SUMMARY

Semiconductor devices according to example embodiments may include a nanostructure and a twin gate and may be driven as memory devices or diodes. Methods of manufacturing such semiconductor devices are also disclosed herein.

A semiconductor device according to example embodiments may include a channel including a nanowire; a source and a drain at both ends of the channel; a tunneling layer on the channel; a charge storage layer on the tunneling layer and including a nanostructure; a blocking layer on the charge storage layer; and a first gate and a second gate on the blocking layer. The first gate and the second gate may be electrically separated from each other, and voltages may be applied to the first gate and the second gate. The nanowire may be ambipolar, and the nanowire may be a carbon nanotube (CNT). The nanostructure may be a nanoparticle. The semiconductor device may be a memory device or a diode.

A method of manufacturing a semiconductor device according to example embodiments may include forming an insulating layer on a substrate; forming a hydrophobic layer with an opening on the insulating layer; forming a channel including a nanowire in the opening; forming a source and a drain at both ends of the channel; sequentially forming a tunneling layer, a charge storage layer including a nanostructure, and a blocking layer on the channel; and forming a first gate and a second gate on the blocking layer.

The forming of the charge storage layer may include forming an adsorption film on the tunneling layer; and attaching the nanostructure on the adsorption film. The adsorption film may be a hydrophilic adsorption film or a hydrophobic adsorption film. The hydrophilic adsorption film may include aminopropyl-triexothysilane (APTES) or [(3-mercaptopropyl)trimethoxysilane] (MPTMS). The hydrophobic adsorption film may include octadecyl-trichlorosilane (OTS), octadecyl-trimethoxysilane (OTMS), or octadecyl-triethoxysilane (OTE).

BRIEF DESCRIPTION OF THE DRAWINGS

The above and/or other aspects of example embodiments will become more apparent and readily appreciated when the following description is taken in conjunction with the accompanying drawings of which:

FIG. 6 is a cross-sectional diagram of an array structure of the semiconductor device of FIG. 1, according to a non-limiting embodiment of the present invention.

DETAILED DESCRIPTION

Figure 1:
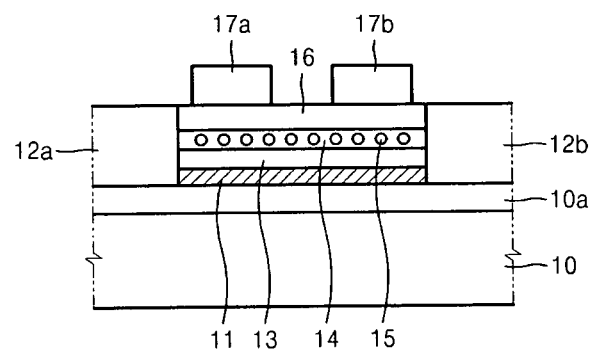
FIG. 1 is a cross-sectional diagram of a semiconductor device, according to a non-limiting embodiment of the present invention.

It will be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms, "comprises," "comprising," "includes," and/or "including," if used herein, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Unless otherwise defined, all terms (including technical and scientific terms) used herein have the same meaning as commonly understood by one of ordinary skill in the art. It will be further understood that terms, including those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional diagram of a semiconductor device, according to a non-limiting embodiment of the present invention. Referring to FIG. 1, a channel 11 may be formed on a substrate 10. The channel 11 may include a nanowire, wherein the nanowire may be an ambipolar material having characteristics of both an n-type semiconductor and a p-type semiconductor (e.g., a carbon nanotube (CNT)). The channel 11 may include a plurality of ambipolar nanowires. An insulating layer 10a formed of an insulating material (e.g., $SiO_2$, glass, $Al_2O_3$, $ZrO_2$, or $HfO_2$) may be formed on the substrate 10.

A source 12a and a drain 12b that contacts the channel 11 may be respectively formed at both sides of the channel 11. The source 12a and the drain 12b may each be formed of a conductive material. For example, the conductive material may be a metal (e.g., Al, Au, Ag, Ni, Ti, Ru, Zn, Pd, or Ir), a conductive metal oxide (e.g., ITO), or a semiconductor material doped with impurities.

A tunneling layer 13 and a charge storage layer 14 may be sequentially formed on the channel 11. The tunneling layer 13 may be formed of an insulating material, for example, $SiO_2$, $Al_2O_3$, $ZrO_2$, $HfO_2$, although example embodiments are not limited thereto. The charge storage layer 14 may include a nanostructure 15. The nanostructure 15 may include, for example, nanoparticles. The nanoparticles may be formed of a metal (e.g., Au), a metal oxide, or a semiconductor. The nanostructure 15 may be formed by forming a pattern using a hydrophilic or hydrophobic material on the tunneling layer 13 through a photolithography process and then placing the nanostructure 15 on a specific part of the substrate 10. In a non-limiting embodiment, when the nanoparticles are formed of Au, a hydrophilic material, for example, aminopropyl-triexothysilane (APTES) or [(3-mercaptopropyl)trimethoxysilane] (MPTMS) may be used. A blocking layer 16 may be formed on the charge storage layer 14 including the nanostructure 15. The blocking layer 16 may be formed of, for example, $SiO_2$, $Al_2O_3$, $ZrO_2$, $HfO_2$, or other suitable insulating materials. The tunneling layer 13, the charge storage layer 14 excluding the nanostructure 15, and the blocking layer 16 may be formed of the same material.

At least two gates may be formed on the blocking layer 16. For example, a twin gate including a first gate 17a and a second gate 17b may be formed. The first gate 17a and the second gate 17b may be formed of a conductive material (for example, a metal (e.g., Al, Au, Ag, Ni, Ti, Ru, Zn, Pd, or Ir)), a conductive metal oxide (e.g., ITO), or a semiconductor material doped with impurities. Voltages having different polarities and magnitudes may be respectively applied to the first gate 17a and the second gate 17b. For example, a positive voltage may be applied to the first gate 17a and a negative voltage may be applied to the second gate 17b or vice versa. Based on the voltage applied to the first gate 17a and the second gate 17b, the semiconductor device according to the current non-limiting embodiment may be selectively driven as a memory device or a diode, which will be described later.

Hereinafter, a method of manufacturing the semiconductor device according to a non-limiting embodiment of the present invention will be described with reference to FIGS. 2A through 2H. FIGS. 2A through 2H are perspective views illustrating a method of manufacturing the semiconductor device of FIG. 1, according to a non-limiting embodiment of the present invention.

Figure 2A:
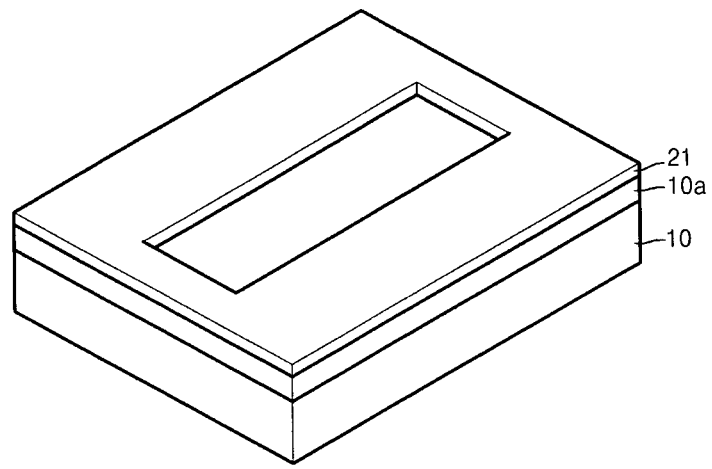
FIGS. 2A through 2H are perspective views illustrating a method of manufacturing the semiconductor device of FIG. 1, according to a non-limiting embodiment of the present invention.

Referring to FIG. 2A, the insulating layer 10a is formed on the substrate 10. A hydrophobic layer 21 is formed on the insulating layer 10a. A predetermined area of the hydrophobic layer 21 is opened, and the hydrophobic layer 21 may be formed of a hydrophobic material including octadecyl-trichlorosilane (OTS), octadecyl-trimethoxysilane (OTMS), or octadecyl-triethoxysilane (OTE).

Forming the hydrophobic layer 21 will now be described in more detail. A photoresist (not illustrated) may be formed on one region of the insulating layer 10a by using, for example, photolithography. A solution including a hydrophobic material may be introduced to a region around the photoresist. Thus, the hydrophobic layer 21 may be formed only on the region other than the region where the photoresist is formed. A solvent (e.g., hexane) of the solution including the hydrophobic material may not dissolve the photoresist. After the hydrophobic layer 21 is formed, the photoresist may be selectively removed by using an appropriate solvent (e.g., acetone). It should be understood that the hydrophobic layer 21 may be formed using various other methods. Consequently, the hydrophobic layer 21 may be formed while the insulating layer 10a is partially exposed.

Figure 2B:
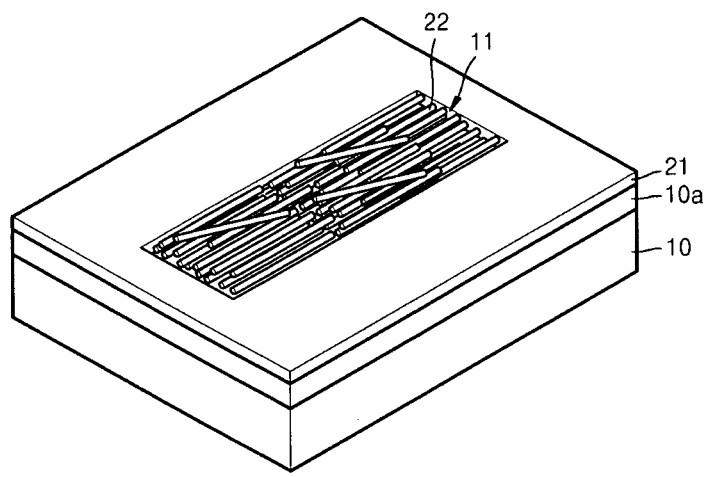

Referring to FIG. 2B, a nanowire, for example, a carbon nanotube (CNT) 22, may be formed or otherwise provided on the opened area of the hydrophobic layer 21 (the area where the insulating layer 10a is exposed). The CNT 22 may be adsorbed to the opened area of the hydrophobic layer 21 by using a solution in which the CNT 22 is dispersed. The CNT 22 may be such so that it does not adsorb to a hydrophobic material but, instead, will adsorb only to a non-hydrophobic layer (e.g., hydrophilic layer) or an area where a hydrophobic material is not formed. In a non-limiting embodiment, the CNT 22 may adsorb onto the insulating layer 10a exposed by the opened area of the hydrophobic layer 21. In order to facilitate adsorption of the CNT 22, a hydrophilic material, for example, APTES or MPTES, may be coated on the insulating layer 10a in the opened area of the hydrophobic layer 21. A solvent for the CNT 22 may not affect the CNT 22 and may be, for example, dichlorobenzene.

Figure 2C:
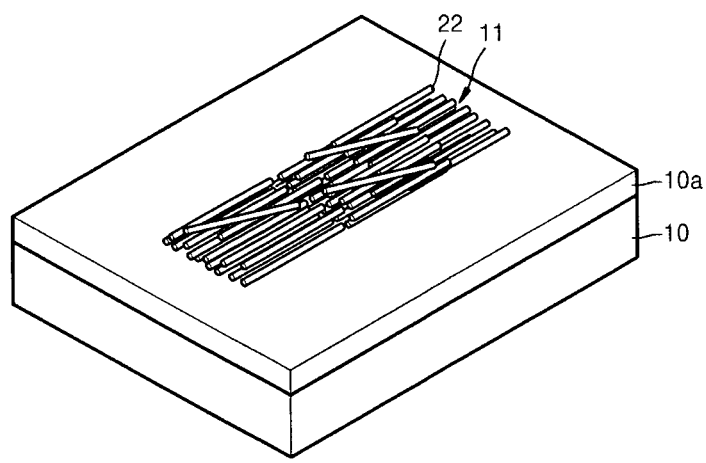

Referring to FIG. 2C, the hydrophobic layer 21 may be selectively removed. Consequently, the channel 11 including a self-assembled CNT 22 may be formed only in a specific area of the insulating layer 10a. It should be known that the channel 11 may have other shapes and dimensions than as shown in FIG. 2C.

Figure 2D:
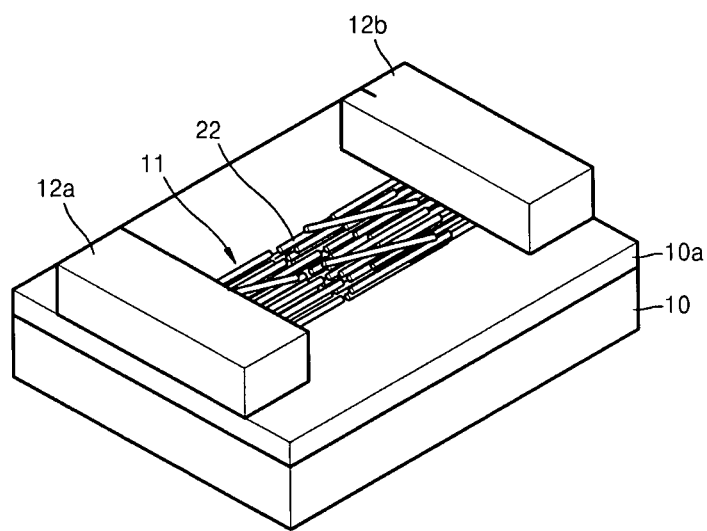

Referring to FIG. 2D, the source 12a and the drain 12b that contact the channel 11, respectively, may be formed at both sides of the channel 11. The source 12a and the drain 12b may each be formed of a conductive material, for example, a metal (e.g., Al, Au, Ag, Ni, Ti, Ru, Zn, Pd, or Ir), a conductive metal oxide (e.g., ITO), or a semiconductor material doped with impurities.

Figure 2E:
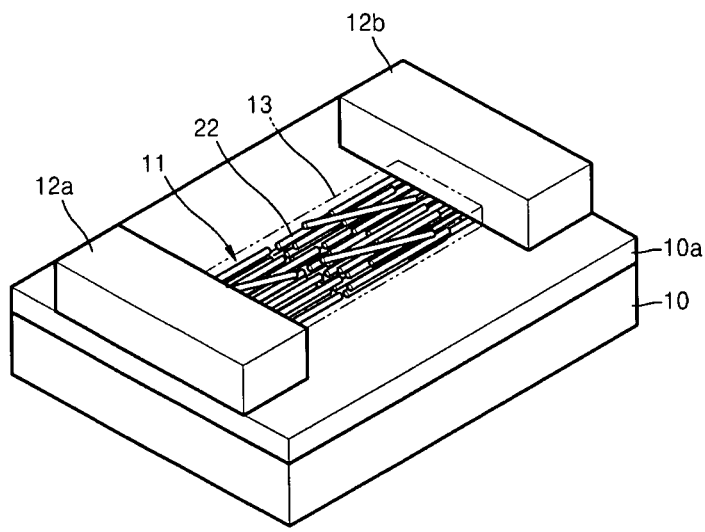

Referring to FIG. 2E, the tunneling layer 13 may be formed by coating an insulating material on the channel 11. The tunneling layer 13 may be formed of an insulating material, for example, $SiO_2$, $Al_2O_3$, $ZrO_2$, $HfO_2$, or another suitable oxide. Deposition of the tunneling layer 13 may be by way of plasma enhanced chemical vapor deposition (PECVD), chemical vapor deposition (CVD), or atomic layer (ALD). When the tunneling layer 13 is formed, the characteristics of the CNT 22 may not change due to a relatively high temperature or a plasma process. Also, the tunneling layer 13 formed on the source 12a and the drain 12b may be selectively removed.

Figure 2F:
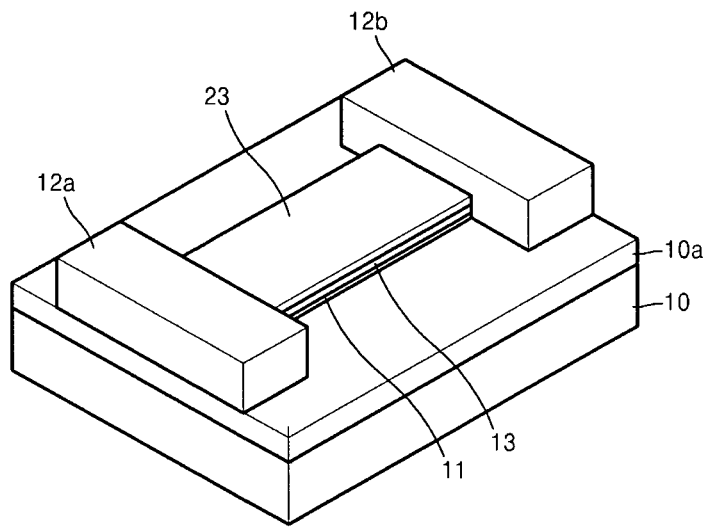

A charge storage layer 14 including the nanostructure 15 may be formed on the tunneling layer 13. The charge storage layer 14 including the nanostructure 15 may be formed by using various methods. Herein below, forming an adsorption film and forming a nanostructure on the adsorption film are described. Referring to FIG. 2F, an adsorption film 23 may be formed on the tunneling layer 13. The adsorption film 23 may be a hydrophilic adsorption film including a hydrophilic molecule or a hydrophobic adsorption film including a hydrophobic molecule according to the type of the nanostructure 15.

Forming of the adsorption film 23 including a hydrophilic molecule is described below. A photoresist may be coated on the tunneling layer 13 by using photolithography, and patterning may be performed to maintain the photoresist on the area corresponding to the channel 11. The tunneling layer 13 may be exposed to a solution including a hydrophobic material, and a hydrophobic film (not illustrated) may be formed on the area where the photoresist is not coated. After the photoresist is removed using acetone, the tunneling layer 13 that corresponds to the channel 11 may be opened. A solution including hydrophilic molecules may be injected into the opened area. The hydrophilic molecules may remain only on the area where the hydrophobic film is not formed (e.g., the tunneling layer 13 that corresponds to the channel 11), such that the adsorption film 23 is formed. The hydrophobic molecule may be OTS, OTMS, or OTE, and the hydrophilic molecule may be APTES or MPTMS, although example embodiments are not limited thereto. A solvent of the solution in which the hydrophilic molecules are dispersed may be ethanol, hexane, or another suitable solvent.

Figure 2G:
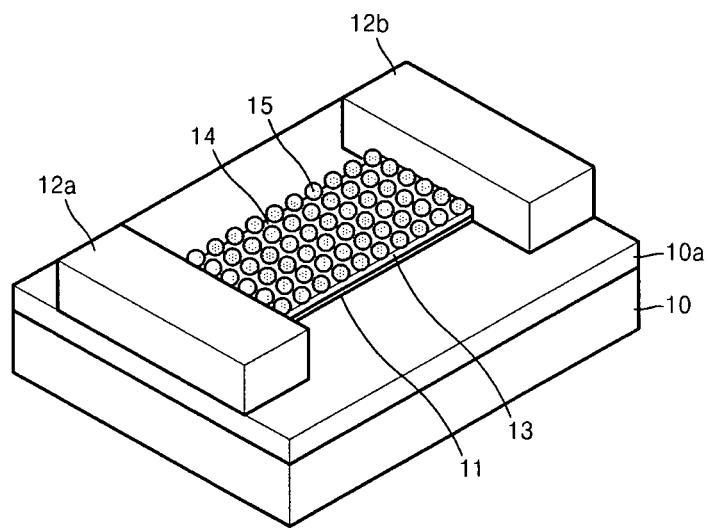

Referring to FIGS. 2F and 2G, the nanostructures 15 may be attached to the adsorption film 23, thereby forming the charge storage layer 14. The nanostructures 15 may be nanoparticles formed of a metal, a metal oxide, or a semiconductor. Attaching the nanostructures 15 will now be described. When the intermediate structure illustrated in FIG. 2F is put in a solution in which the nanostructures 15 are dispersed, the nanostructures 15 may become selectively attached to the adsorption film 23. Stated more clearly, the nanostructures 15 may be selectively attached in a desired position via self-assembly. Thus, the charge storage layer 14 may be formed with relative ease. In FIG. 2G, the nanostructures 15 are illustrated as being exposed. However, it should be understood that the charge storage layer 14 may be formed so as to partially or completely cover all of the nanostructures 15.

Figure 2H:
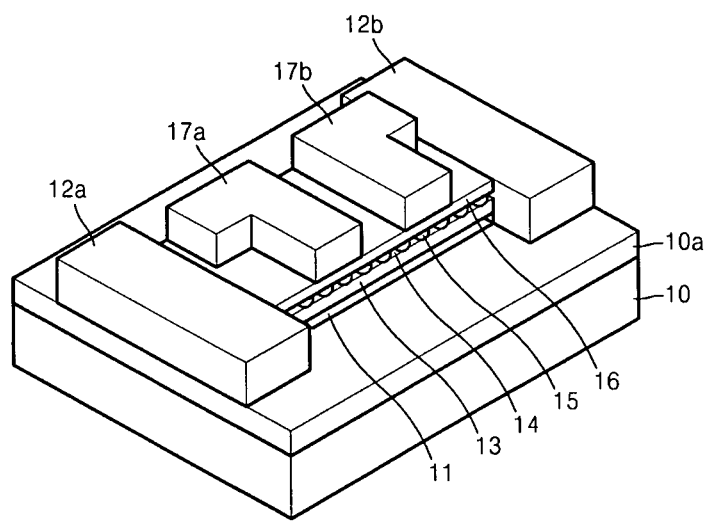

Referring to FIG. 2H, an insulating material may be coated on the charge storage layer 14, thereby forming the blocking layer 16. The blocking layer 16 may be formed of, for example, $SiO_2$, $Al_2O_3$, $ZrO_2$, $HfO_2$, or another suitable insulating material by using deposition process (e.g., PECVD, CVD, or ALD). The blocking layer 16 may have a larger thickness than that of the tunneling layer 13. The blocking layer 16 may also be formed to expose the source 12a and the drain 12b.

A twin gate including the first gate 17a and the second gate 17b may be formed on the blocking layer 16. The first gate 17a and the second gate 17b may be each formed of a conductive material by using physical vapor deposition (PVD), E-beam lithography, or thermal evaporation. The first gate 17a and the second gate 17b are formed to be electrically separated from each other, and voltages of different polarities and magnitudes are respectively applied to the first gate 17a and the second gate 17b.

The semiconductor device according to the current non-limiting embodiment may be driven like a memory device or a diode. Hereinafter, characteristics of the semiconductor device according to the current non-limiting embodiment of the present invention will be described.

If the semiconductor device is driven like a memory device, then voltages higher than a threshold voltage and having the same polarity may be applied to the first gate 17a and the second gate 17b, respectively. For example, +10V voltages may be applied to the first gate 17a and the second gate 17b, respectively. Accordingly, electrons from the channel 11 (e.g., negative polarity charges) may tunnel through the tunneling layer 13 and become trapped in the nanostructures 15 of the charge storage layer 14. On the other hand, if -10V voltages are applied to the first gate 17a and the second gate 17b, respectively, then holes from the channel 11 (e.g., positive polarity charges) may tunnel through the tunneling layer 13 and become trapped in the nanostructures 15 of the charge storage layer 14.

When the electrons with negative polarity charges are trapped in the charge storage layer 14, the semiconductor device has a characteristic of a p-type transistor. On the other hand, when the holes with positive polarity charges are trapped in the charge storage layer 14, the semiconductor device has a characteristic of an n-type transistor. Accordingly, the semiconductor device may be driven like a memory device based on the trapping of the electrons or holes as 1 or 0 units of information stored in the charge storage layer 14.

Figure 3:
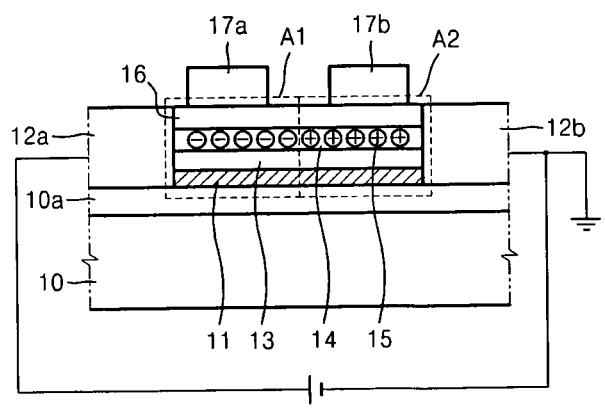
FIGS. 3 and 4 are cross-sectional diagrams of the semiconductor device of FIG. 1, driven as a diode, according to a non-limiting embodiment of the present invention.

The use of the semiconductor device as a diode will described below with reference to FIGS. 3 through 5. Referring to FIG. 3, voltages having different polarities may be applied to the first gate 17a and the second gate 17b, respectively. For example, a +10V voltage may be applied to the first gate 17a, and a -10V voltage may be applied to the second gate 17b. Accordingly, electrons may become trapped in the nanostructure 15 of the charge storage layer 14 in area A1 that corresponds to the first gate 17a. Conversely, holes may become trapped in the nanostructure 15 of the charge storage layer 14 in area A2 that corresponds to the second gate 17b. Because the nanowire included in the channel 11 is ambipolar, the channel 11 in the area A1 has a positive polarity and may be driven like a p-type, and the channel 11 in the area A2 has a negative polarity and may be driven like an n-type. Accordingly, a part where the channel 11 in the area A1 and the channel 11 in the area A2 join with each other may have a p-n junction characteristic.

Figure 4:
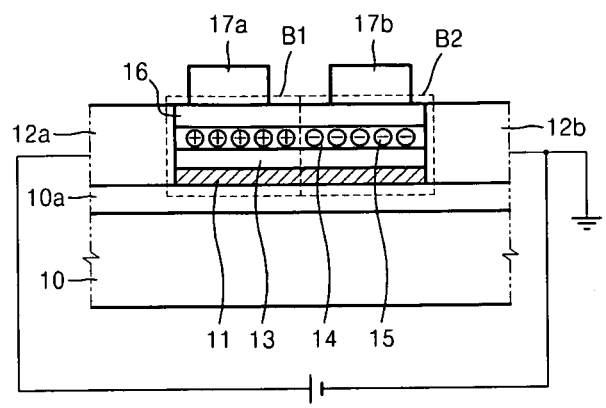

Referring to FIG. 4, voltages opposite to those applied to the first gate 17a and the second gate 17b in FIG. 3 may be applied to the first gate 17a and the second gate 17b, respectively. For example, a −10V voltage may be applied to the first gate 17a and a +10V voltage may be applied to the second gate 17b. Accordingly, holes may become trapped in the nanostructure 15 of the charge storage layer 14 in area B1 that corresponds to the first gate 17a. Conversely, electrons may become trapped in the nanostructure 15 of the charge storage layer 14 in area B2 that corresponds to the second gate 17b. In this case, the channel 11 in the area B1 has a negative polarity and may be driven like an n-type, and the channel 11 in the area B2 may have a positive polarity and can be driven like a p-type. Consequently, a part where the channel 11 in the area B1 and the channel 11 in the area B2 join with each other may have a n-p junction characteristic.

As described above, two gate voltages may be independently controlled so that a p-n junction may be changed with relative ease to an n-p junction and vice versa. Accordingly, a polarity-switchable diode, which may change the type of a semiconductor device as desired, may be obtained.

Figure 5:
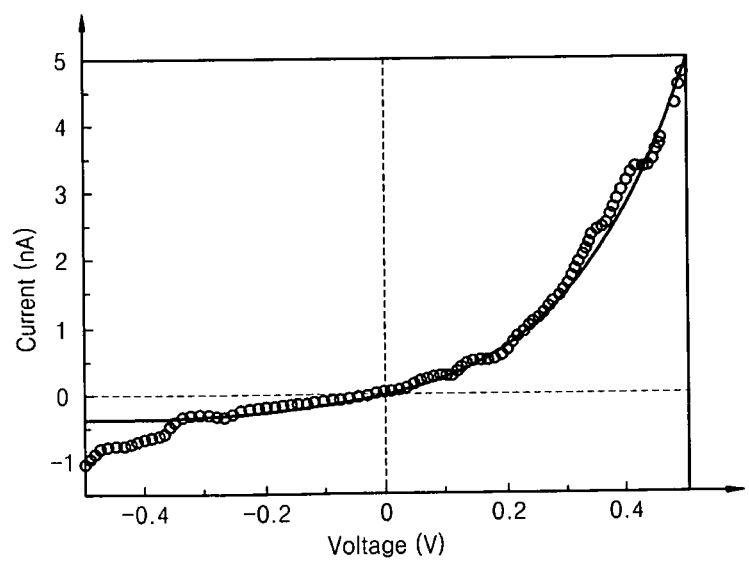
FIG. 5 is a graph showing a voltage-current characteristic of the semiconductor device of FIG. 1, according to a non-limiting embodiment of the present invention.

FIG. 5 is a graph showing a voltage-current characteristic of the semiconductor device of FIG. 1, according to a non-limiting embodiment of the present invention. When polarities of voltage applied to the first gate 17a and the second gate 17b are different from each other, a graph showing a typical diode characteristic may be obtained.

As described above, the semiconductor device according to the current non-limiting embodiment of the present invention may control voltages applied to the first gate 17a and the second gate 17b in a twin structure and, thus, may be driven as a memory device or a diode.

FIG. 6 is a cross-sectional diagram of an array structure of the semiconductor device of FIG. 1, according to a non-limiting embodiment of the present invention. Referring to FIG. 6, a plurality of semiconductor devices, as illustrated in FIG. 1, may be formed. Each of the plurality of semiconductor devices may be referred to as a first unit device C1, a second unit device C2, a third unit device C3, a fourth unit device C4, and a fifth unit device C5. Each of the unit devices C1 to C5 may be selectively used as a memory device or a diode. For example, the first unit device C1 through the fourth unit device C4 may be used as memory devices, and the fifth unit device C5 may be used as a diode. Alternatively, the first unit device C1, the third unit device C3, and the fifth unit device C5 may be used as memory devices, and the second unit device C2 and the fourth unit device C4 may be used as diodes. Accordingly, in an array structure including a plurality of semiconductor devices, each of the devices may be independently driven as a memory device or a diode. Thus, the semiconductor device according to a non-limiting embodiment of the present invention may be formed to have an array structure and, thus, may be formed as a relatively highly integrated hybrid device (e.g., a memory device or a device including a variable junction device in a current direction).

As described above, according to example embodiments of the present invention, a twin gate including a first gate and a second gate may be formed on the charge storage layer including a nanostructure, and thus, a memory device and a diode may be realized with relative ease.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims. Thus, descriptions of features or aspects with regard to each embodiment should typically be considered as available for other similar features or aspects in other embodiments.

What is claimed is:

1. A semiconductor device comprising:
   a channel including a nanowire;
   a source and a drain at both ends of the channel;
   a tunneling layer on the channel;
   a charge storage layer including an adsorption film and a nanostructure, the adsorption film being on the tunneling layer, the nanostructure being on the adsorption film;
   a blocking layer on the charge storage layer; and
   a first gate and a second gate on the blocking layer,
   wherein an uppermost surface of the charge storage layer is below uppermost surfaces of the source and the drain, and the adsorption film is a hydrophilic adsorption film or a hydrophobic adsorption film.

2. The semiconductor device of claim 1, wherein the first gate and the second gate are electrically separated from each other and configured for the application of voltages thereto.

3. The semiconductor device of claim 1, wherein the nanowire is ambipolar.

4. The semiconductor device of claim 1, wherein the nanowire is a carbon nanotube (CNT).

5. The semiconductor device of claim 1, wherein the nanostructure is a nanoparticle.

6. The semiconductor device of claim 1, wherein the semiconductor device is a memory device or a diode.

7. The semiconductor device of claim 1, wherein an uppermost surface of the blocking layer is flush with uppermost surfaces of the source and the drain.

8. The semiconductor device of claim 1, wherein the blocking layer does not overlap the source and the drain.

9. The semiconductor device of claim 1, wherein the first gate and the second gate do not overlap the source and the drain.

10. The semiconductor device of claim 1, wherein the hydrophilic adsorption film includes aminopropyl-triexothysilane (APTES) or [(3-mercaptopropyl) trimethoxysilane] (MPTMS).

11. The semiconductor device of claim 1, wherein the hydrophobic adsorption film includes octadecyl-trichlorosilane (OTS), octadecyl-trimethoxysilane (OTMS), or octadecyl-triethoxysilane (OTE).

* * * * *